United States Patent
Shah et al.

(10) Patent No.: US 9,959,078 B2
(45) Date of Patent: May 1, 2018

(54) MULTI-DIE ROLLING STATUS MODE FOR NON-VOLATILE STORAGE

(71) Applicant: SANDISK TECHNOLOGIES INC., Plano, TX (US)

(72) Inventors: Grishma Shah, San Jose, CA (US); Jack Frayer, Boulder Creek, CA (US); Aaron Olbrich, Milpitas, CA (US); Chang Siau, Saratoga, CA (US); Vidyabhushan Mohan, Milpitas, CA (US); Gopinath Balakrishnan, Santa Clara, CA (US); Robert Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 14/929,004

(22) Filed: Oct. 30, 2015

(65) Prior Publication Data
US 2016/0224246 A1 Aug. 4, 2016

Related U.S. Application Data

(60) Provisional application No. 62/110,367, filed on Jan. 30, 2015.

(51) Int. Cl.
*G06F 12/00* (2006.01)
*G06F 3/06* (2006.01)

(52) U.S. Cl.
CPC ............ *G06F 3/0688* (2013.01); *G06F 3/061* (2013.01); *G06F 3/0625* (2013.01); *G06F 3/0659* (2013.01); *Y02B 60/1246* (2013.01)

(58) Field of Classification Search
CPC .......... G06F 12/00; G06F 12/04; G06F 12/08; G06F 12/0238; G06F 12/0246; G06F 12/0253; G06F 3/0679; G06F 3/06
(Continued)

(56) References Cited

U.S. PATENT DOCUMENTS 5,438,536 A 8/1995 Salzman
5,457,787 A 10/1995 Asano
(Continued)

OTHER PUBLICATIONS

U.S. Appl. No. 15/042,169, filed Feb. 12, 2016.
(Continued)

*Primary Examiner* — Tuan Thai
(74) *Attorney, Agent, or Firm* — Vierra Magen Marcus LLP

(57) ABSTRACT

Systems and methods for increasing performance and reducing power consumption of a non-volatile memory system while the system acquires status information from a plurality of memory die are described. The non-volatile memory system may include a plurality of memory die and a system controller for controlling operations performed by each memory die of the plurality of memory die (e.g., read operations, write operations, or erase operations). The system controller may transmit or broadcast a first status command to each memory die of the plurality of memory die and in response simultaneously or concurrently receive one or more sets of status information from each memory die of the plurality of memory die. The status information may include ready/busy status information (e.g., indicating that a memory die is able to receive new data), programming loop count information, and erase loop count information.

20 Claims, 10 Drawing Sheets

(58) Field of Classification Search
USPC .................................. 711/100, 103, 154, 200
See application file for complete search history.

(56) References Cited

U.S. PATENT DOCUMENTS

| | | | |
|---|---|---|---|
| 5,579,262 A * | 11/1996 | Song | G11C 16/3436 365/185.19 |
| 5,640,349 A | 6/1997 | Kakinuma | |
| 6,249,461 B1 | 6/2001 | Choi | |
| 6,442,076 B1 | 8/2002 | Roohparvar | |
| 7,809,901 B2 | 10/2010 | Huber | |
| 7,843,758 B2 | 11/2010 | Byeon | |
| 7,865,657 B2 | 1/2011 | Kim | |
| 7,966,445 B2 | 6/2011 | Hobler | |
| 8,144,496 B2 | 3/2012 | Cheng | |
| 8,266,361 B1 | 9/2012 | Jikku | |
| 8,819,328 B2 | 8/2014 | Lassa | |
| 8,843,692 B2 | 9/2014 | Oh | |
| 8,923,065 B2 | 12/2014 | Prasad | |
| 9,003,102 B2 | 4/2015 | Lassa | |
| 2002/0188897 A1 | 12/2002 | Ruckerbauer | |
| 2008/0209077 A1* | 8/2008 | Im | G06F 12/0661 710/9 |
| 2008/0215771 A1 | 9/2008 | Osaki | |
| 2009/0125762 A1 | 5/2009 | Wang | |
| 2010/0165748 A1* | 7/2010 | Thiruvengadam | G11C 8/06 365/185.33 |
| 2011/0299317 A1* | 12/2011 | Shaeffer | G11C 13/0002 365/106 |
| 2013/0254467 A1 | 9/2013 | Parizi | |
| 2013/0326090 A1 | 12/2013 | Gillingham | |
| 2013/0339555 A1 | 12/2013 | Schushan | |
| 2013/0339638 A1 | 12/2013 | Lazmi | |
| 2014/0047158 A1 | 2/2014 | Frans | |
| 2014/0250262 A1 | 9/2014 | Buxton | |
| 2015/0067232 A1* | 3/2015 | Fontana | G06F 12/0246 711/103 |
| 2015/0100744 A1 | 4/2015 | Mirichigni | |
| 2015/0134882 A1 | 5/2015 | Lin | |
| 2015/0134883 A1 | 5/2015 | Lin | |
| 2015/0134884 A1 | 5/2015 | Lin | |
| 2015/0187399 A1 | 7/2015 | Tuers | |
| 2015/0261452 A1* | 9/2015 | Moon | G06F 3/0616 711/103 |
| 2016/0092116 A1* | 3/2016 | Liu | G11C 5/025 711/103 |

OTHER PUBLICATIONS

Kang, et al., "A multi-channel architecture for high-performance NAND flash-based storage system" Korea Advanced Institute of Science and Technology, Dec. 9, 2005.
Cooke, "The inconvenient truths of NAND flash memory," Micron Technology, Inc., Aug. 2007.
Office Action dated Jun. 30, 2017, U.S. Appl. No. 15/042,169.
Response to Office Action dated Nov. 20, 2017, U.S. Appl. No. 15/042,169.

* cited by examiner

| Multi-chip setting | F_MCM param | | | Die# | CADD (2,1,0) | CE# | Status on IO # | IO bits pulled down to 0 |
|---|---|---|---|---|---|---|---|---|
| | 4n | 2n | Die/CE | | | | | |
| 2 die | 1 | 0 | 2 | 0 | b000 | CE0 | IO0 | IO2/4/6 |
| | | | | 1 | b001 | CE0 | IO1 | IO3/5/7 |
| 2 die | 1 | 1 | 1 | 0 | b000 | CE0 | IO0 | IO1/2/3/4/5/6/7 |
| | | | | 1 | b001 | CE1 | IO1 | IO0/2/3/4/5/6/7 |
| 4 die | 0 | 1 | 4 | 0 | b000 | CE0 | IO0 | IO4 |
| | | | | 1 | b001 | | IO1 | IO5 |
| | | | | 2 | b010 | | IO2 | IO6 |
| | | | | 3 | b011 | | IO3 | IO7 |
| 4 die | 1 | 0 | 2 | 0 | b000 | CE0 | IO0 | IO2/4/6 |
| | | | | 1 | b001 | | IO1 | IO3/5/7 |
| | | | | 2 | b010 | CE1 | IO2 | IO0/4/6 |
| | | | | 3 | b011 | | IO3 | IO1/5/7 |
| 8 die | 0 | 0 | 8 | 0 | b000 | CE0 | IO0 | None |
| | | | | 1 | b001 | | IO1 | None |
| | | | | 2 | b010 | | IO2 | None |
| | | | | 3 | b011 | | IO3 | None |
| | | | | 4 | b100 | | IO4 | None |
| | | | | 5 | b101 | | IO5 | None |
| | | | | 6 | b110 | | IO6 | None |
| | | | | 7 | b111 | | IO7 | None |
| 8 die | 0 | 1 | 4 | 0 | b000 | CE0 | IO0 | IO4 |
| | | | | 1 | b001 | | IO1 | IO5 |
| | | | | 2 | b010 | | IO2 | IO6 |
| | | | | 3 | b011 | | IO3 | IO7 |
| | | | | 4 | b100 | CE1 | IO4 | IO0 |
| | | | | 5 | b101 | | IO5 | IO1 |
| | | | | 6 | b110 | | IO6 | IO2 |
| | | | | 7 | b111 | | IO7 | IO3 |

MULTI-DIE ROLLING STATUS MODE FOR NON-VOLATILE STORAGE

CLAIM OF PRIORITY

The present application claims priority to U.S. Provisional Application No. 62/110,367, entitled "Multi-Die Rolling Status Mode for Non-Volatile Storage," filed Jan. 30, 2015, which is herein incorporated by reference in its entirety.

BACKGROUND

Semiconductor memory is widely used in various electronic devices such as mobile phones, digital cameras, personal digital assistants, SSDs, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

It is common for semiconductor memory die to be placed into a package to allow for easier handling and assembly, and to protect the die from damage. Although a plural form of "die" is "dice," it is common industry practice to use "die" as a plural form as well as the singular form. In one example, semiconductor memory die and/or other integrated circuits, such as processors, may be encased within a package wherein the die may be stacked on top of one another within the package. The package may comprise a surface-mount package (e.g., a BGA package or TSOP package). One benefit of vertically stacking die within a package (e.g., stacking 16 die within a single package) is that form factor and/or package size may be reduced. In some cases, the package may comprise a stacked multi-chip package, a system-in-package (SiP), or a chip stack multichip module (MCM). Vertical connections between the stacked die including direct vertical connections through a die's substrate (e.g., through a silicon substrate) may be formed within each die before or after die-to-die bonding.

BRIEF DESCRIPTION OF THE DRAWINGS

FIG. 4 depicts one embodiment of a chart describing various system configurations.

DETAILED DESCRIPTION

Figure 1A:
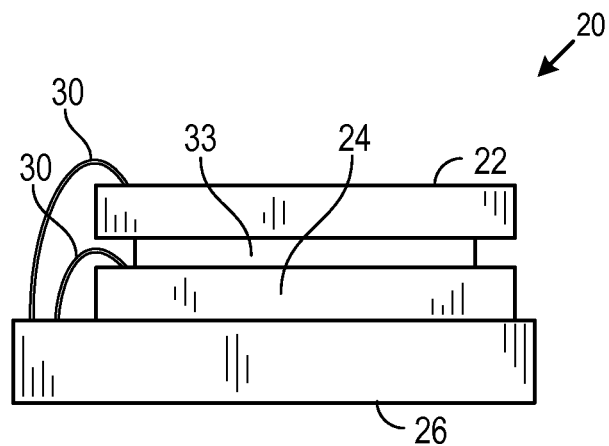
FIGS. 1A-1C depict various embodiments of a plurality of stacked die within a semiconductor package.

Technology is described for increasing performance and reducing power consumption of a non-volatile memory system while the system acquires status information from a plurality of memory die. The non-volatile memory system may include a plurality of memory die and a system controller for controlling operations performed by each memory die of the plurality of memory die (e.g., read operations, write operations, or erase operations). The plurality of memory die may comprise multiple die within a package. The system controller may transmit or broadcast a first status command to each memory die of the plurality of memory die and in response simultaneously or concurrently receive one or more sets of status information from each memory die of the plurality of memory die. The status information may include ready/busy status information (e.g., indicating that a memory die can receive new data), truebusy status information (e.g., indicating that a memory die is currently performing a memory operation), programming loop count information (e.g., indicating the number of programming loops that have been completed for a programming operation), erase loop count information (e.g., indicating the number of erase loops that have been completed for an erase operation), and status information regarding whether a particular programming state has been reached (e.g., the "A" programming state or the "F" programming state) for each memory die of the plurality of memory die.

In one embodiment, the plurality of memory die may comprise eight memory die and the status information may be received by the system controller via an 8-bit bus connecting the system controller to each of the plurality of memory die. The system controller may concurrently receive various types of per die status information over a shared I/O bus. For example, a first status command may specify that ready/busy status information and loop count information be transmitted from each memory die of the plurality of memory die in response to receiving the first status command. The loop count information for a first memory die may comprise programming loop count information and the loop count information for a second memory die may comprise erase loop count information. The system controller may identify whether the loop count information corresponds with a programming loop count or an erase loop count as the system controller may be responsible for issuing programming and erase commands to each memory die of the plurality of memory die. The program or erase loop count may be used by the system controller to determine how far along a memory die is to completing a programming or erase operation (e.g., the memory die has at most 10 more programming cycles before completing a programming operation) and to determine how to schedule or order future memory operations for each memory die of the plurality of memory die.

In the case of eight memory die, each bit of the 8-bit bus may be driven by one of the eight memory die at the same time. The determination of which bit of the 8-bit bus is driven by a particular memory die of the eight memory die may be determined via bonded pin connections made at the package level. For example, a three-bit CADD address identifying which bit position within the 8-bit bus should be driven by a memory die may be set by connecting three bond pads of the memory die to voltages corresponding with the three-bit CADD address. The determination of which bit of the 8-bit bus is driven by a particular memory die may also be determined via configuration information stored within non-volatile memory within the particular memory die (e.g., trimfuse bits or trimbits may be programmed within each memory die specifying a CADD address).

The system controller may receive one or more sets of status information from each memory die of a plurality of memory die using a subset of bits of a shared I/O bus. In one embodiment, a plurality of memory die may comprise four memory die within a package that are connected to a system controller via an 8-bit I/O bus and a first status command issued by the system controller may specify that two-bits of status information are driven by each memory die of the plurality of memory die during a status information cycle. In one example, a first memory die of the plurality of memory die may drive a first set of two bits of the 8-bit bus (e.g., bus[1:0]) and a second memory die of the plurality of memory die may drive a second set of two bits of the 8-bit bus (e.g., bus[3:2]). In one example, the first set of two bits may correspond with read or write pass/fail information for two memory planes within the first memory die and the second set of two bits may correspond with read or write pass/fail information for two memory planes within the second memory die. Memory planes may correspond with different memory arrays within a memory die.

The system controller may broadcast a status command to the plurality of memory die corresponding with the type of status information to be transmitted from the plurality of memory die. In response, the system controller may receive different sets of status information based on the status command broadcast to the plurality of memory die. For example, a first status command may correspond with receiving ready/busy status information and a second status command may correspond with receiving ready/busy status information followed by truebusy status information and loop count information. Ready/busy status information (or cachebusy status information) may correspond with whether a memory die is able to receive new data as it has data latches that are ready to accept the new data (e.g., the memory die may be able to accept 8-bits of data to be programmed during a programming operation). Truebusy status information may correspond with whether a memory die is currently performing a memory operation (e.g., a programming operation or a read operation). Although a memory die may be performing a memory operation (e.g., a programming operation) and its truebusy status bit is set to "1", the ready/busy status bit may be set to "0" as the memory die may have data latches available to accept new data for a subsequent memory operation. A status bit may comprise a status signal that is true if set to "1" and false if set to "0." In some cases, a status bit may be inverted or negated; for example, truebusyN may comprise a status signal that is true if set to "0" and false if set to "1." Similarly, cachebusyN may comprise a status signal that is true if set to "0" and false if set to "1"."

The status information may also include plane 1 multi-level cell (MLC) program or erase status information and plane 0 MLC program or erase status information. For example, if a memory die has two memory planes and if an MLC programming operation was successful for plane 1 of the memory die, then PB1_MLC[N] may be set to "1" and if an MLC programming operation was not successful for plane 0 of the memory die, then PB0_MLC[N] may be set to "0." In another example, if an erase operation was not successful for plane 1 of the memory die, then plane1_erase [N] may be set to "0" and if an erase operation was successful for plane 0 of the memory die, then plane0_erase [N] may be set to "1." The status information may also include plane 1 MLC program or erase status information and/or plane 0 MLC program or erase status information for a prior memory operation. In this case, a system controller may issue a first memory command corresponding with a first memory operation to be performed by a memory die (e.g., a current operation or the Nth operation) and a second memory command corresponding with a second memory operation to be performed by the memory die (e.g., a previous operation or the N−1th operation). In this case, the system controller may issue a first status command and receive status information corresponding with a current operation and a previous operation for each memory die. For example, if an MLC programming operation for a current operation was successful for plane 1 of a memory die, then PB1_MLC[N] may be set to "1" and if an MLC programming operation for a previous memory operation was not successful for plane 1 of the memory die, then PB1_MLC [N−1] may be set to "0."

In one embodiment, a particular status command may cause a first memory die of a plurality of memory die to transmit only ready/busy status information and a second memory die of the plurality of memory die to transmit ready/busy status information followed by truebusy status information and loop count information. In another embodiment, a particular status command may cause a first memory die of a plurality of memory die to transmit ready/busy status information during a status information cycle and a second memory die of the plurality of memory die to transmit truebusy status information or other status information different from ready/busy status information during the status information cycle. In another embodiment, a particular status command may cause a first memory die of a plurality of memory die to transmit programming loop count information during a status information cycle and a second memory die of the plurality of memory die to transmit erase loop count information during the status information cycle.

In some embodiments, a particular status command broadcast by a system controller may direct each memory die of a plurality of memory die to output status information corresponding with a memory operation state of the memory die. In one example, a first memory die of the plurality of memory die may be performing a programming operation and output programming loop count information in response to the particular status command while a second memory die of the plurality of memory die may be performing a read operation and output ready/busy status information and/or read pass/fail status information in response to the particular status command. In this case, portions of the programming loop count and the read pass/fail status information may be concurrently received by the system controller or received by the system controller at the same time. In another example, a first memory die of the plurality of memory die may be performing a programming operation and output programming loop count information in response to the particular status command while a second memory die of the plurality of memory die may be performing an erase operation and output erase loop count information in response to the particular status command.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 1B:
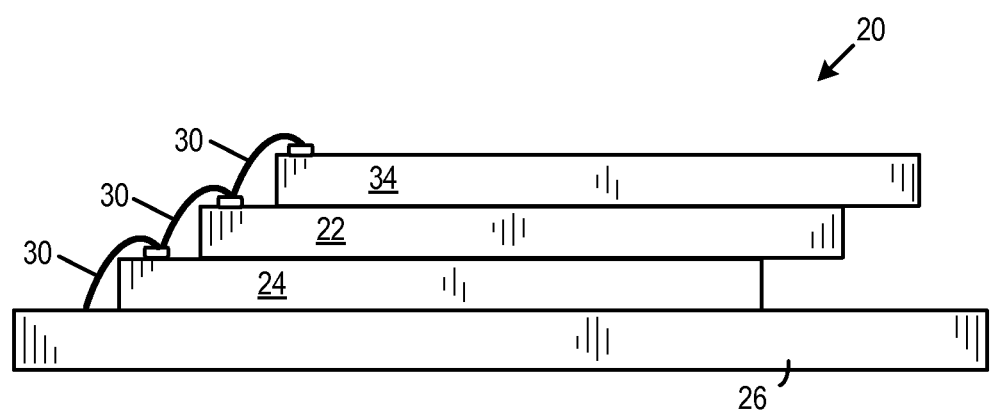
Figure 1C:
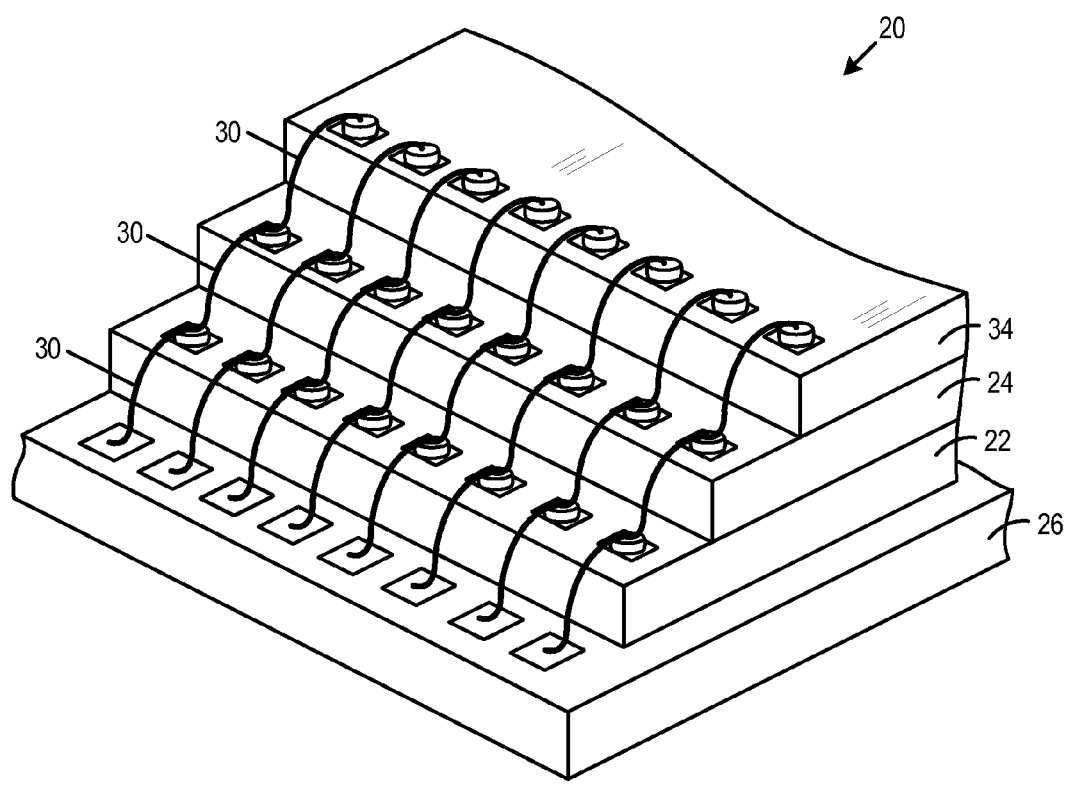

FIGS. 1A-1C depict various embodiments of a plurality of stacked die within a semiconductor package 20. As depicted, a plurality of semiconductor die, such as die 22, 24, and 34 may be mounted to a substrate 26 and encased within the semiconductor package 20. In one example, each of die 22, 24, and 34 may comprise a semiconductor memory die. In another example, die 22 may comprise a flash memory die and die 24 may comprise a memory controller. In some embodiments, the number of vertically stacked die within a package may comprise more than two die (e.g., 8 or 16 die within the package). Each of the semiconductor die may include bond pads on an upper surface of the die for allowing electrical access to integrated circuitry within the die. Each bond pad may correspond with an input pin, an output pin, or an input/output (I/O) pin that connects to the integrated circuitry. Wire bonding connections, such as bond wires 30, may be used to electrically connect a die with other die within the package or to substrate 26. The bond wires 30 may comprise a metal such as copper, aluminum, or gold.

As depicted in FIG. 1A, two or more semiconductor die may be stacked directly on top of each other, thereby taking up a small footprint on the substrate 26. However, in a vertically stacked configuration without through-silicon vias (TSVs), space must be provided between adjacent semiconductor die for the bond wire connections. A dielectric spacer layer 33 may be used to provide space for the bond wires 30 to be bonded to bond pads on the lower die 24. As depicted in FIGS. 1B-1C, instead of stacking die directly above each other, each of the stacked semiconductor die may be offset such that the bond pads on one side of each die are exposed.

Figure 2A:
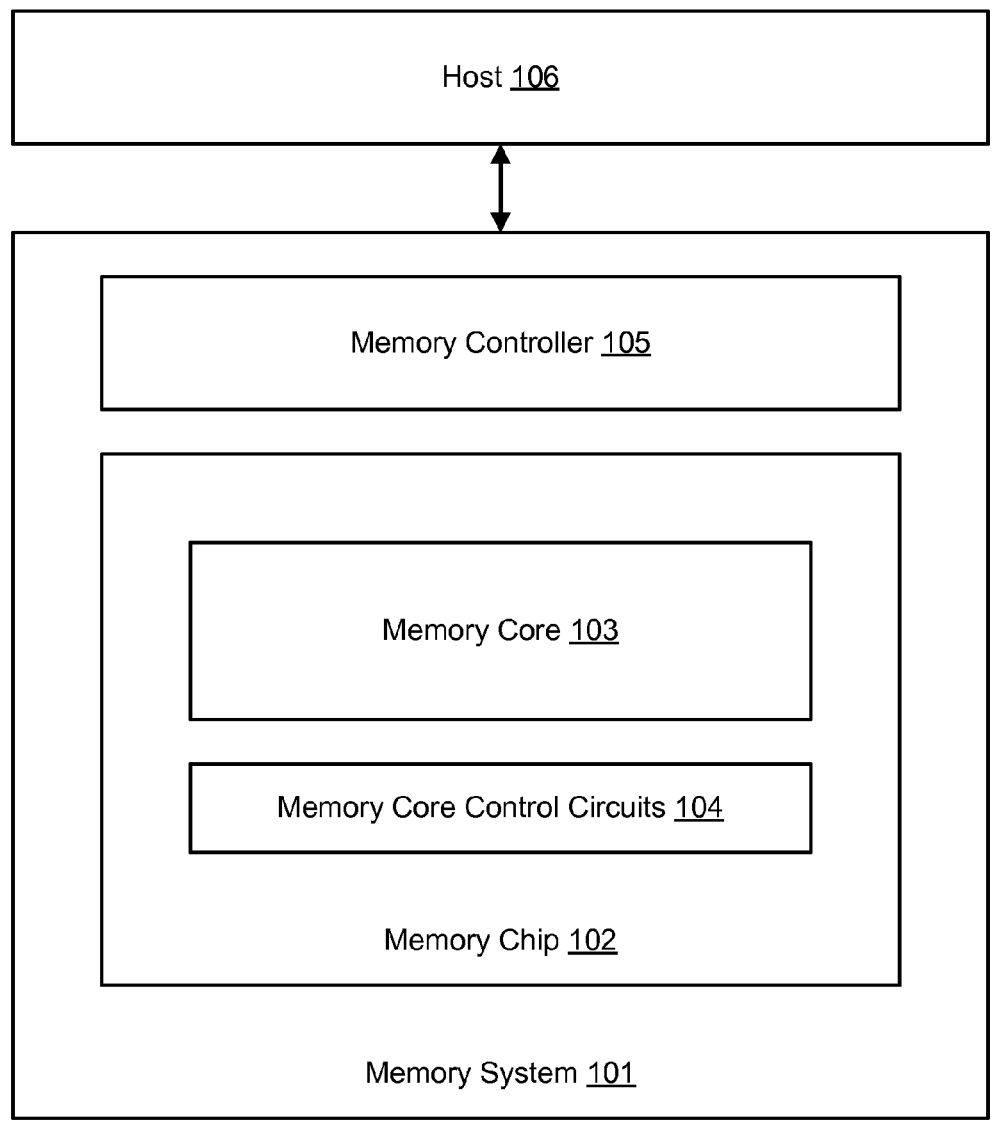
FIG. 2A depicts one embodiment of a memory system and a host.

FIG. 2A depicts one embodiment of a memory system 101 and a host 106. The host 106 may comprise a computing device (e.g., a personal computer, audio player, digital camera, or mobile computing device) or a storage device (e.g., an enterprise storage device). The memory system 101 may comprise a memory card, a flash drive, a system on a chip (SOC), or an embedded memory system. In one embodiment, the memory system 101 may be embedded within a multi-chip package. As depicted, the memory system 101 includes a memory controller 105 and a memory chip 102. In some cases, a memory system, such as memory system 101, may include more than one memory chip or memory die. In one example, the memory system 101 may include 16 NAND die stacked within a multi-chip package. The memory controller 105 may include one or more state machines, control logic, page registers, non-volatile memory, SRAM, or other circuitry for controlling the operation of memory chip 102. The one or more state machines, control logic, page registers, non-volatile memory, SRAM, and/or other circuitry for controlling the operation of the memory chip 102 may be referred to as managing or control circuits. The managing or control circuits may be used to facilitate one or more memory array operations associated with the memory chip 102 including erasing, programming, and reading operations. The memory controller 105 may receive data and commands from host 106 and provide memory chip data to host 106. In some embodiments, the memory controller 105 and memory chip 102 may be arranged on a single integrated circuit. In other embodiments, memory controller 105 and memory chip 102 may be arranged on different integrated circuits.

As depicted, the memory chip 102 includes memory core control circuits 104 and memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. The memory cells may comprise floating-gate transistors or non-volatile memory technologies that employ charge trapping, phase-change (e.g., chalcogenide materials), or state-change materials. In one embodiment, the memory core control circuits 104 and memory core 103 are arranged on a single integrated circuit. In other embodiments, the memory core control circuits 104 and memory core 103 may be arranged on different integrated circuits.

Referring to FIG. 2A, a memory system operation may be initiated when host 106 sends instructions to memory controller 105 indicating that it would like to read data from memory system 101 or write data to memory system 101. In the event of a write (or programming) operation, host 106 may send to memory controller 105 both a write command and the data to be written. The data to be written may be buffered by memory controller 105 and error correcting code (ECC) data may be generated corresponding with the data to be written. The ECC data, which allows data errors that occur during transmission or storage to be detected and/or corrected, may be written to memory core 103 or stored in non-volatile memory within memory controller 105. In one embodiment, the ECC data is generated and data errors are corrected by circuitry within memory controller 105.

In some cases, the operation of memory chip 102 may be controlled by memory controller 105. In one example, before issuing a write operation to memory chip 102, memory controller 105 may check a status register to make sure that memory chip 102 is able to accept the data to be written. In another example, before issuing a read operation to memory chip 102, memory controller 105 may pre-read overhead information associated with the data to be read. The overhead information may include ECC data associated with the data to be read or a redirection pointer to a new memory location within memory chip 102 in which to read the data requested. Once a read or write operation is initiated by memory controller 105, memory core control circuits 104 may generate the appropriate bias voltages for word lines and bit lines within memory core 103, as well as generate the appropriate memory block, row, and column addresses. The memory controller 105 may manage the translation (or mapping) of logical addresses received from the host 106 into physical addresses associated with the memory chip 102. The mapping tables for mapping the logical addresses corresponding with logical groups of data to physical address corresponding with memory locations within memory chip 102 may be stored within memory controller 105 or within memory chip 102.

In some embodiments, memory controller 105 may control one or more memory chips within a memory system. Each of the one or more memory chips may be organized into a plurality of memory blocks. In some cases, each of the one or more memory chips may be organized into a plurality of metablocks. A metablock may comprise a plurality of memory blocks. A memory block may comprise a group of memory cells that are erased concurrently (i.e., a unit of erase). In some cases, the group of memory cells may comprise a binary cache or a group of multi-level cells for storing user data. Each of the plurality of memory blocks may include a plurality of pages. A page may comprise a group of memory cells that may be accessed, programmed, and/or read concurrently. The group of memory cells within a page may share a common word line. In some cases, a memory block may comprise 32, 64, or 128 pages and each page may comprise 2 KB or 4 KB of data.

Figure 2B:
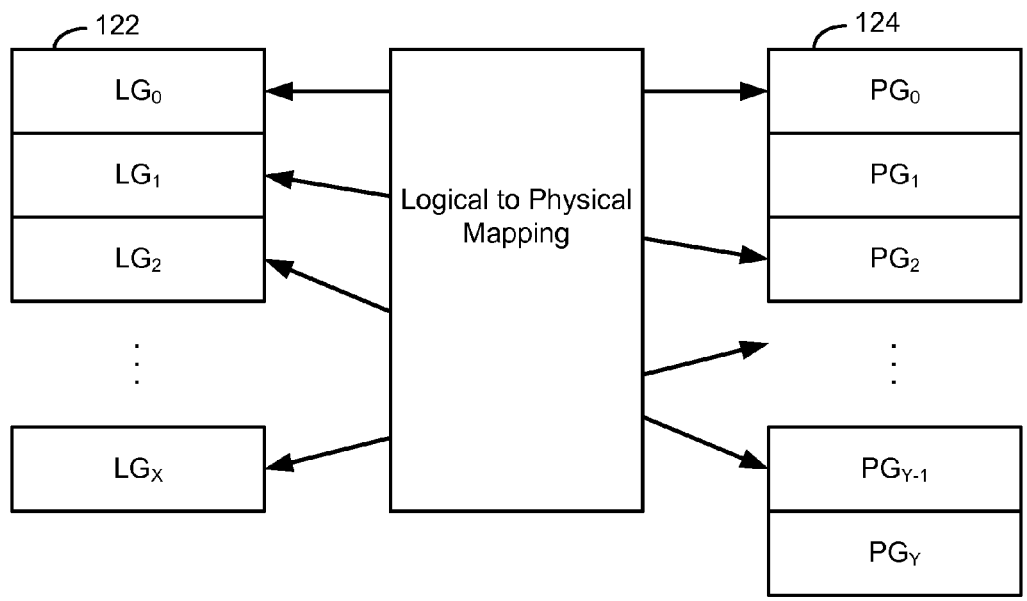
FIG. 2B depicts one embodiment of a mapping between logical groups and physical groups as performed by a memory system.

FIG. 2B depicts one embodiment of a mapping between logical groups and physical groups as performed by a memory system, such as memory system 101 in FIG. 2A. As depicted, each logical group of logical groups 122 (e.g., represented as a logical block address) is mapped to a unique physical group of physical groups 124 (e.g., represented as a memory block or page address). A logical group may be associated with a metablock, a page, or a portion of a page. In some cases, a logical group may comprise a grouping of one or more logical sectors which are mapped to a metablock. The logical to physical mapping between the logical groups and the physical groups may be stored in a table or list within a non-volatile memory, such as memory core 103 in FIG. 2A. In some cases, each logical group may be mapped to a metablock address. In one embodiment, a Group Address Table (GAT) may be used to store a mapping of metablock addresses for each logical group within a memory system.

Figure 2C:
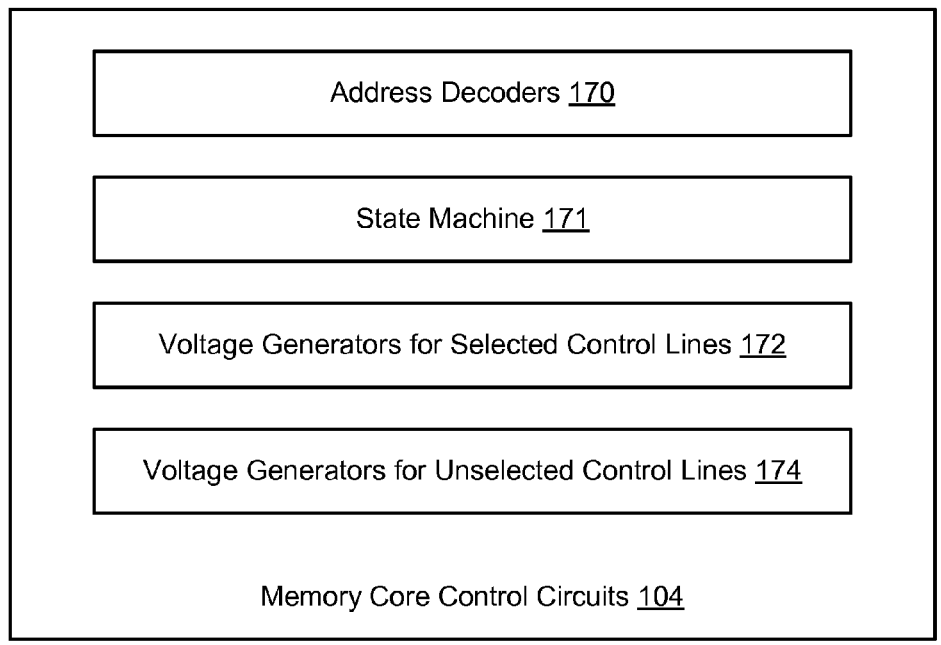
FIG. 2C depicts one embodiment of memory core control circuits.

FIG. 2C depicts one embodiment of memory core control circuits 104 in FIG. 2A. As depicted, the memory core control circuits 104 include address decoders 170, state machine 171, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block or memory array. The state machine 171 may provide chip-level control of memory operations. In one example, state machine 171 may cause various voltages to be applied to control lines (e.g., selected word lines and unselected word lines) within a memory array corresponding with a particular memory operation (e.g., a read or write operation). The state machine 171 may implement control logic for controlling read, write, or erase operations.

Figure 2D:
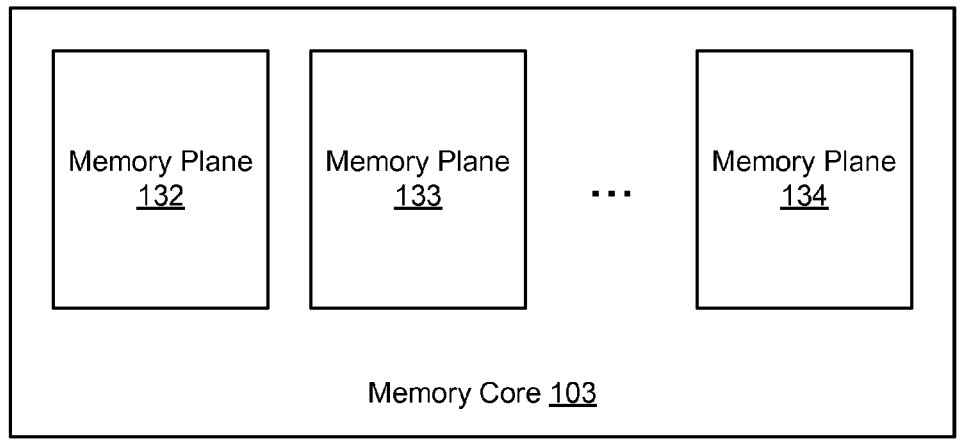
FIG. 2D depicts one embodiment of a memory core.

FIG. 2D depicts one embodiment of memory core 103 in FIG. 2A. As depicted, memory core 103 includes memory planes 132-134. In some embodiments, the number of memory planes (or bays) per memory core can be different for different implementations. For example, a memory core may include only a single memory plane or a plurality of memory planes (e.g., 16 memory planes). Each memory plane may comprise one or more memory blocks. Each memory block may comprise one or more memory cells. In some cases, multiple memory planes may be operated in parallel to increase read and/or write bandwidth. Although a memory core organization is depicted where memory planes comprise memory blocks, and memory blocks comprise a group of memory cells, other organizations or groupings can also be used with the technology described herein.

Figure 2E:
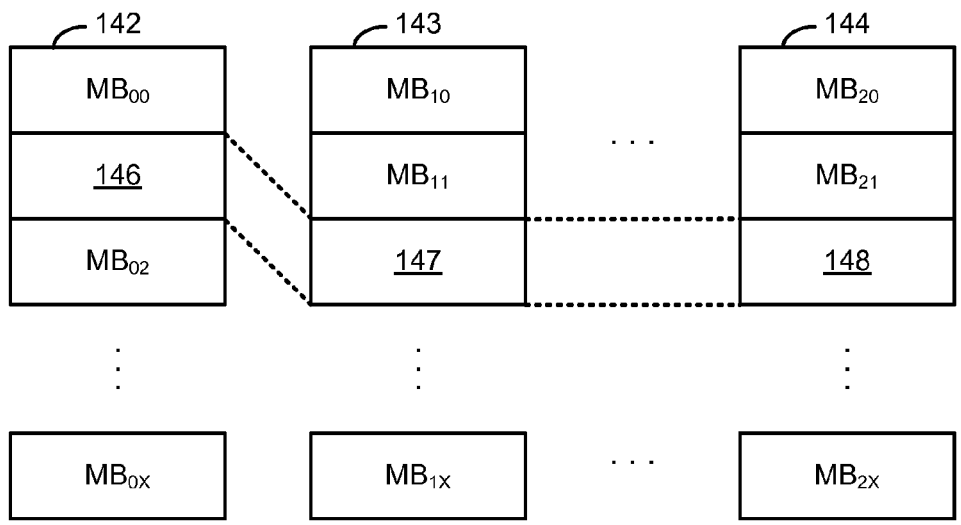
FIG. 2E depicts one embodiment of a memory core organization including a plurality of memory planes.

FIG. 2E depicts one embodiment of a memory core organization including a plurality of memory planes. The memory planes 142-144 each comprise a plurality of physical groups. Each physical group may comprise a memory block (e.g., memory block $MB_{00}$). In some cases, memory blocks across the plurality of physical groups may be linked together to form a metablock. For example, memory blocks 146-148 may be linked together to form a metablock. As depicted, the memory blocks used to form a metablock may be from various locations within their respective memory planes. For example, memory block 146 from memory plane 142, memory block 147 from memory plane 143, and memory block 148 from memory plane 144 may be linked together to form a metablock or a portion of a metablock. As each of the memory blocks may include a plurality of pages, a metapage extending across each of the memory planes 142-144 may be created by linking pages from each of the memory blocks within a metablock together. In some embodiments, a subset of the memory blocks within a memory plane may correspond with one or more spare blocks.

Figure 3:
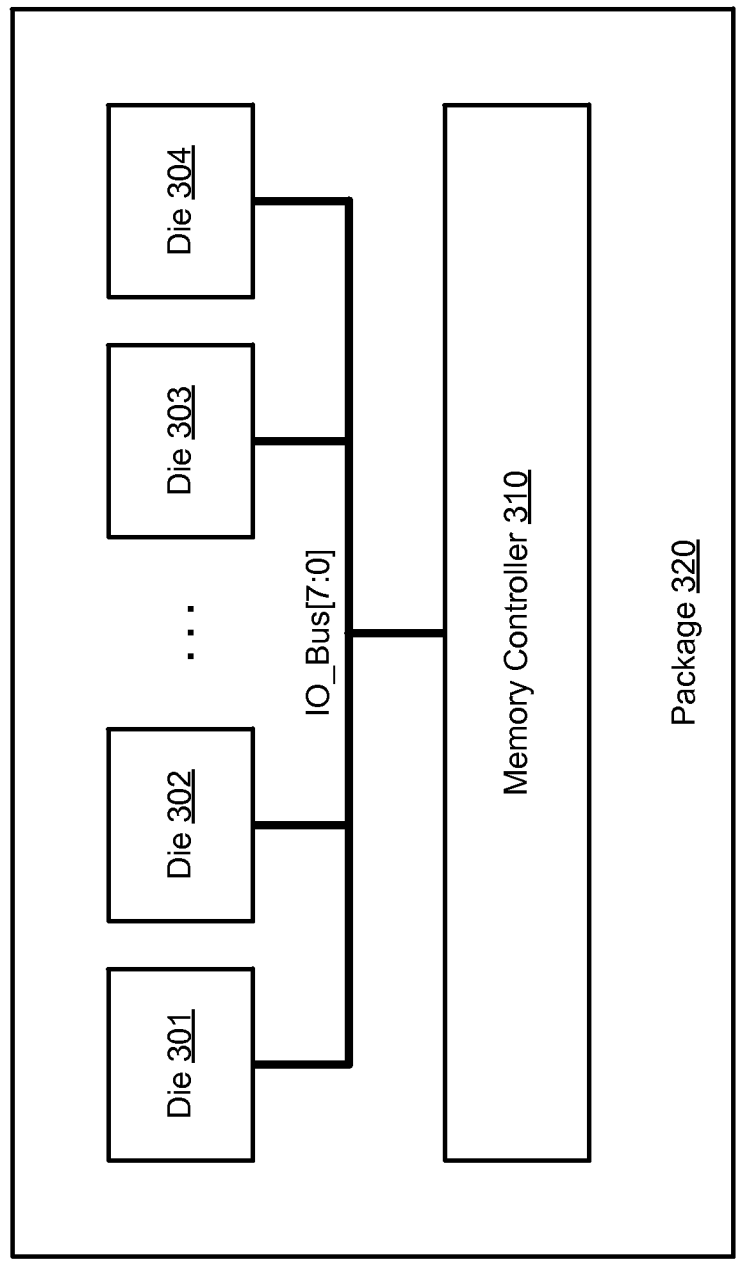
FIG. 3 depicts one embodiment of a portion of a memory system.

FIG. 3 depicts one embodiment of a portion of a system, such as memory system 101 in FIG. 2A, included within a package 320. The portion of the system comprises memory die 301-304 and memory controller 310 connected to the memory die 301-304 via a shared 8-bit I/O bus I/O_Bus[7:0]. Although only four memory die are depicted in FIG. 3, the memory controller 310 may be connected to or in communication with more than or less than four memory die via a shared I/O bus. In some cases, the memory die 301-304 may be vertically stacked within the package 320 or arranged in a horizontal manner within the package 320. In some cases, the package 320 may comprise a BGA package or TSOP package. As depicted, the memory controller 310 may comprise a memory controller, such as memory controller 105 in FIG. 2A, and may broadcast various status commands and receive data via the shared I/O bus. The memory die 301-304 may comprise NAND Flash memory die. In one embodiment, the set of one or more of bits that is driven by each memory die during a status information cycle may be determined via a CADD address that is specific to each memory die.

FIG. 4 depicts one embodiment of a chart describing various system configurations. System configuration 410 comprises an eight memory die configuration with a single chip enable signal CE0 for each of the eight memory die. In this case, memory die "Die0" is assigned a CADD address "000" corresponding with driving bit "IO0" (bit position "0") of a shared I/O bus and memory die "Die4" is assigned a CADD address "100" corresponding with driving bit "IO4" (bit position "4") of the shared I/O bus. System configuration 412 comprises an eight memory die configuration with two chip enable signals CE0 and CE1, in which CE0 is connected to memory die associated with Die0 through Die3 and CE1 is connected to memory die associated with Die4 through Die7. In this case, memory die "Die1" is assigned a CADD address "001" corresponding with driving bit "IO1" of a shared I/O bus and memory die "Die7" is assigned a CADD address "111" corresponding with driving bit "IO7" of the shared I/O bus. A chip enable signal may be used to enable or disable a set of one or more memory die.

Figure 5:
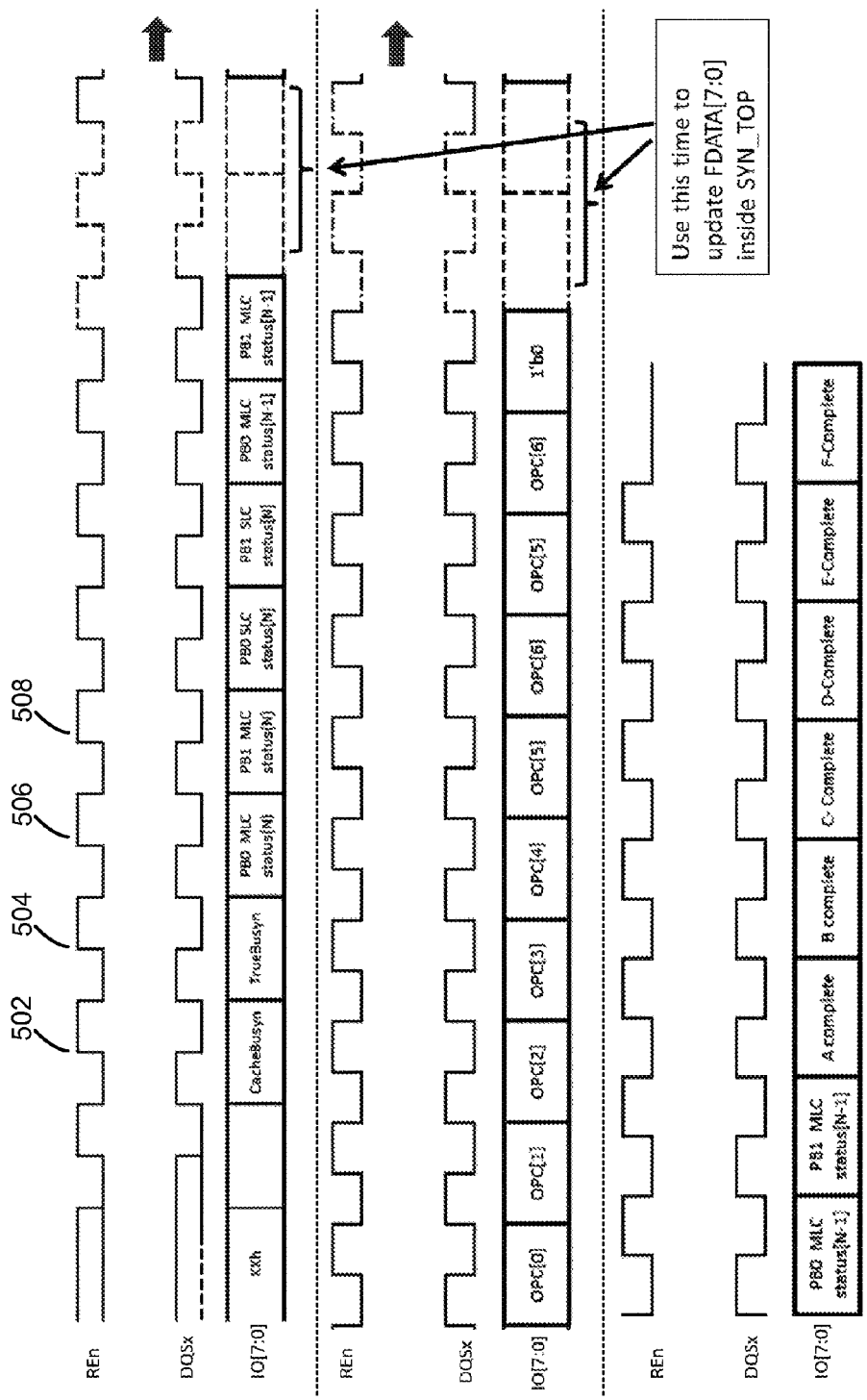
FIG. 5 depicts one embodiment of signal waveforms associated with a memory controller broadcasting a status command and in response concurrently receiving one or more sets of status information from each memory die of a plurality of memory die.

FIG. 5 depicts one embodiment of signal waveforms associated with a memory controller broadcasting a status command and in response concurrently receiving one or more sets of status information from each memory die of a plurality of memory die. As depicted, in response to receiving a particular status command on a shared I/O bus, the plurality of memory die drive CacheBusyn status information during a first status information cycle associated with a rising edge 502 of REn, TrueBusyn status information during a second status information cycle associated with a rising edge 504 of REn, MLC plane 0 status information during a third status information cycle associated with a rising edge 506 of REn, and MLC plane 1 status information during a fourth status information cycle associated with a rising edge 508 of REn. Subsequent status information cycles may include loop count information (e.g., OPC[0] through OPC[6]) and programming state status information (e.g., A-complete through F-complete).

Figure 6A:
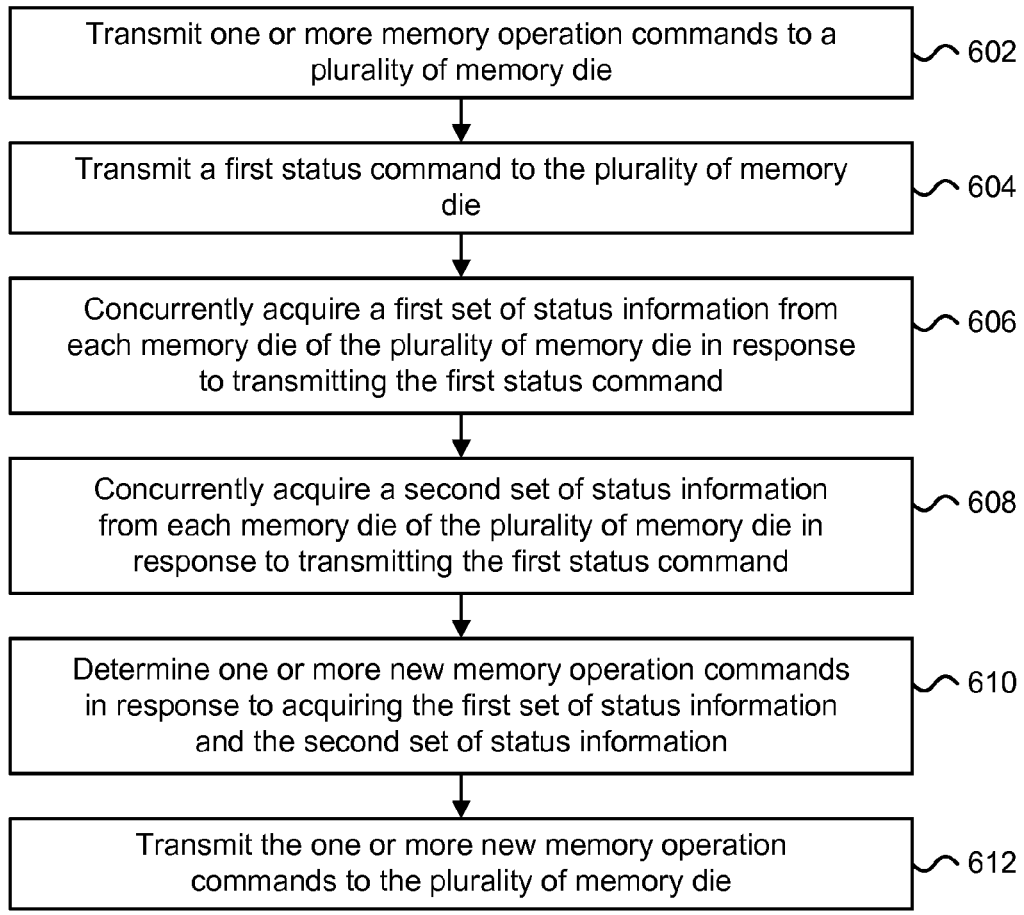
FIG. 6A is a flowchart describing one embodiment of a process for concurrently acquiring one or more sets of status information from each memory die of a plurality of memory die.

FIG. 6A is a flowchart describing one embodiment of a process for concurrently acquiring one or more sets of status information from each memory die of a plurality of memory die. In one embodiment, the process of FIG. 6A may be performed by a non-volatile storage system, such as memory system 101 in FIG. 2A.

In step 602, one or more memory operation commands are transmitted to a plurality of memory die. In one embodiment, the one or more memory operation commands may comprise read commands or programming commands transmitted from a system controller to the plurality of memory die via a shared I/O bus. In one example, the system controller may direct a first memory die of the plurality of memory die to perform a read operation and direct a second memory die of the plurality of memory die to perform a programming operation. In step 604, a first status command is transmitted to the plurality of memory die. In one embodiment, the first status command may be broadcast by the system controller over the shared I/O bus and direct each memory die of the plurality of memory die to transmit one or more sets of status information using the shared I/O bus.

In step 606, a first set of status information is concurrently acquired from each memory die of the plurality of memory die in response to transmitting the first status command. In one example, a first memory die of the plurality of memory die may drive a first bit of the shared I/O bus and a second memory die of the plurality of memory die may drive a second bit of the shared I/O bus during a status information cycle. In step 608, a second set of status information is concurrently acquired from each memory die of the plurality of memory die in response to transmitting the first status command. In one example, the first memory die of the plurality of memory die may drive the first bit of the shared I/O bus and the second memory die of the plurality of memory die may drive the second bit of the shared I/O bus during a second status information cycle subsequent to the status information cycle. The first set of status information may correspond with ready/busy status information and the second set of status information may correspond with loop count information. The loop count information may comprise either programming loop count information or erase loop count information depending on the memory operation performed by a particular memory die.

In step 610, one or more new memory operation commands are determined in response to acquiring the first set of status information and the second set of status information. In this case, the system controller may schedule or order different memory operation commands depending on the status of each memory die of the plurality of memory die. In step 612, the one or more new memory operation commands are transmitted to the plurality of memory die.

In some cases, the system controller may toggle out different status information (e.g., read/busy status and loop count information) using REn toggles over a plurality of status information cycles from a set of memory die. Each of the set of memory die may be connected to the same chip enable signal CEn. This allows the system controller to obtain, for example, ready/busy information concurrently for each memory die of the set of memory die in response to a single status command.

Figure 6B:
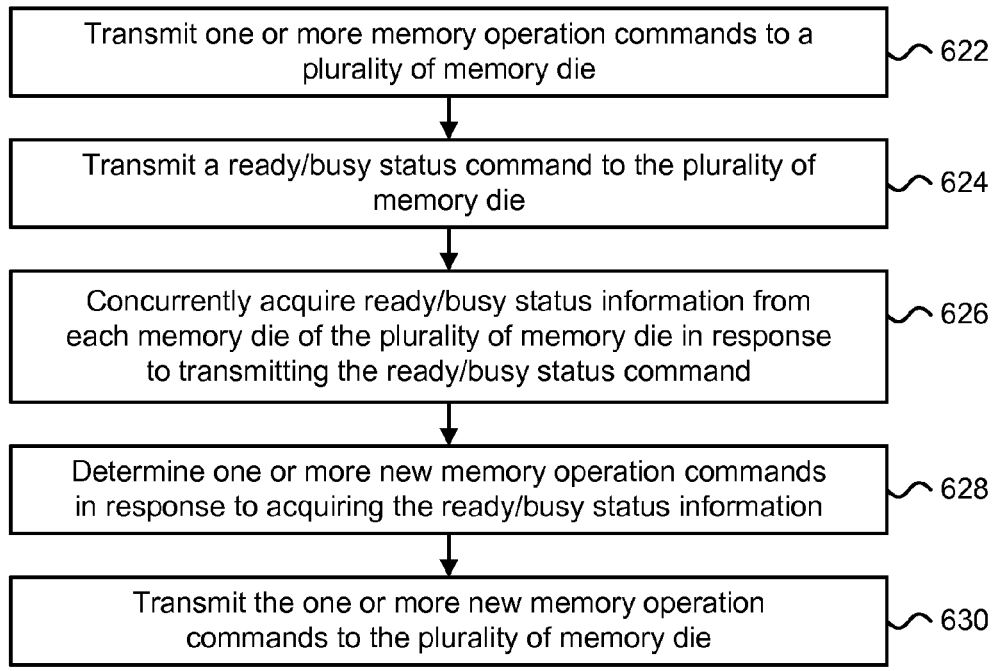
FIG. 6B is a flowchart describing another embodiment of a process for concurrently acquiring one or more sets of status information from each memory die of a plurality of memory die.

FIG. 6B is a flowchart describing another embodiment of a process for concurrently acquiring one or more sets of status information from each memory die of a plurality of memory die. In one embodiment, the process of FIG. 6B may be performed by a non-volatile storage system, such as memory system 101 in FIG. 2A.

In step 622, one or more memory operation commands are transmitted to a plurality of memory die. The plurality of memory die may comprise eight memory die. The memory die may comprise NAND Flash memory die. In one embodiment, the one or more memory operation commands may comprise read commands or programming commands transmitted from a system controller to the plurality of memory die via a shared I/O bus. In one example, the system controller may direct a first memory die of the plurality of memory die to perform a read operation and direct a second memory die of the plurality of memory die to perform a programming operation. In step 624, a ready/busy status command is transmitted to the plurality of memory die. In step 626, ready/busy status information is concurrently acquired from each memory die of the plurality of memory die in response to transmitting the ready/busy status command. In step 628, one or more new memory operation commands are determined in response to acquiring the ready/busy status information. In this case, the system controller may schedule or order different memory operation commands depending on the ready/busy status of each memory die of the plurality of memory die. In step 630, the one or more new memory operation commands are transmitted to the plurality of memory die.

Figure 6C:
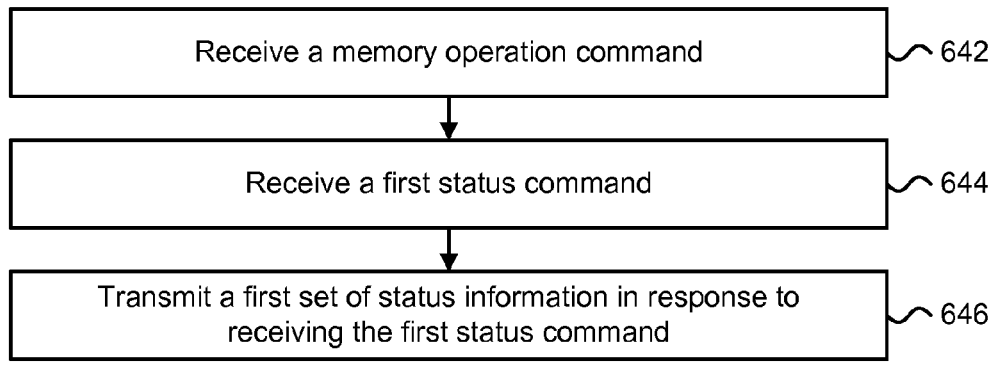
FIG. 6C is a flowchart describing one embodiment of a process for transmitting one or more sets of status information from a memory die.

FIG. 6C is a flowchart describing one embodiment of a process for transmitting one or more sets of status information from a memory die. In one embodiment, the process of FIG. 6C may be performed by a non-volatile storage system, such as memory system 101 in FIG. 2A.

In step 642, a memory operation command is received. The memory operation command may comprise a read operation or a programming operation. The memory operation command may be received by a memory die from a system controller. In step 644, a first status command is received. The first status command may be broadcast from the system controller and direct the memory die to provide status information during one or more status information cycles. In step 646, a first set of status information is transmitted in response to receiving the first status command. The first set of status information may be provided to the system controller using one or more bits of a shared I/O bus. The one or more bits may be determined via a CADD address that specifies which subset of bits of the shared I/O bus may be driven by the memory die. The first set of status information may include status information associated with the memory operation being performed by the memory die.

One embodiment of the disclosed technology includes a plurality of memory die and a system controller configured to broadcast a status command to the plurality of memory die. The system controller configured to concurrently receive at least one bit of status information from each memory die of the plurality of memory die based on the status command.

One embodiment of the disclosed technology includes broadcasting a status command to a plurality of memory die over a shared I/O bus that is connected to each memory die of the plurality of memory die and concurrently receiving a first set of status information from each memory die of the plurality of memory die over the shared I/O bus in response to broadcasting the status command. The status command determines a number of bits of the shared I/O bus to be controlled by each memory die of the plurality of memory die during the concurrently receiving a first set of status information from each memory die of the plurality of memory die.

One embodiment of the disclosed technology includes a plurality of memory die and a system controller. Each memory die of the plurality of memory die comprises non-volatile storage elements. The system controller configured to transmit a status command to the plurality of memory die over a shared I/O bus that is connected to each memory die of the plurality of memory die. The system controller configured to concurrently receive a first set of status information from each memory die of the plurality of memory die in response to transmitting the status command. The status command determines a number of bits of the shared I/O bus to be controlled by each memory die of the plurality of memory die.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a plurality of memory die; and
a controller configured to broadcast a first status command to the plurality of memory die at a first point in time and broadcast a second status command to the plurality of memory die subsequent to the first point in time, the controller configured to concurrently receive at least one bit of first status information from each memory die of the plurality of memory die based on the first status command, the first status command configured to determine a first number of bits to be used by each memory die of the plurality of memory die to send the at least one bit of first status information to the controller, the controller configured to concurrently receive at least one bit of second status information from each memory die of the plurality of memory die based on the second status command, the second status command configured to determine a second number of bits different from the first number of bits to be used by each memory die of the plurality of memory die to send the at least one bit of second status information to the controller.

2. The apparatus of claim 1, wherein:
the controller configured to concurrently receive a first type of status information from a first memory die of the plurality of memory die and a second type of status information different from the first type of status information from a second memory die of the plurality of memory die.

3. The apparatus of claim 2, wherein:
the first type of status information comprises programming loop count information for the first memory die and the second type of status information comprises erase loop count information for the second memory die.

4. The apparatus of claim 2, wherein:
the first type of status information comprises programming loop count information for the first memory die and the second type of status information comprises ready/busy status information for the second memory die.

5. The apparatus of claim 1, wherein:
the controller configured to broadcast the first status command to the plurality of memory die over a shared I/O bus connected to each memory die of the plurality of memory die, the first status command determines the number of bits of the shared I/O bus to be used by each memory die of the plurality of memory die.

6. The apparatus of claim 1, wherein:
the controller configured to determine one or more subsequent memory operation commands based on the at least one bit of first status information and configured to transmit the one or more subsequent memory operation commands to the plurality of memory die.

7. The apparatus of claim 1, wherein:
the at least one bit of first status information comprises two bits of status information.

8. The apparatus of claim 1, wherein:
the plurality of memory die includes a first memory die, the first memory die includes non-volatile memory that is monolithically formed in one or more physical levels of memory cells having active areas disposed above a silicon substrate.

9. A method, comprising:
broadcasting a first status command to a plurality of memory die over a shared I/O bus connected to each memory die of the plurality of memory die;
broadcasting a second status command to the plurality of memory die over the shared I/O bus connected to each memory die of the plurality of memory die subsequent to broadcasting the first status command to the plurality of memory die;
simultaneously receiving a first set of first status information from each memory die of the plurality of memory die over the shared I/O bus in response to broadcasting the first status command, the first status command defines a first number of bits of the shared I/O bus to be used by each memory die to send the first set of first status information; and
simultaneously receiving a second set of second status information from each memory die of the plurality of memory die over the shared I/O bus in response to broadcasting the second status command, the second status command defines a second number of bits different from the first number of bits of the shared I/O bus to be used by each memory die to send the second set of second status information.

10. The method of claim 9, wherein:
the simultaneously receiving the first set of first status information from each memory die of the plurality of memory die includes simultaneously receiving a first type of status information from a first memory die of the plurality of memory die and a second type of status information different from the first type of status information from a second memory die of the plurality of memory die.

11. The method of claim 10, wherein:
the first type of status information comprises programming loop count information for the first memory die and the second type of status information comprises erase loop count information for the second memory die.

12. The method of claim 10, wherein:
the first type of status information comprises erase loop count information for the first memory die and the second type of status information comprises truebusy status information for the second memory die.

13. The method of claim 9, wherein:
the simultaneously receiving the first set of first status information from each memory die of the plurality of memory die includes simultaneously receiving two bits of status information from each memory die of the plurality of memory die.

14. The method of claim 9, further comprising:
determining one or more subsequent memory operation commands based on the first set of first status information; and
transmitting the one or more subsequent memory operation commands to the plurality of memory die.

15. The method of claim 9, wherein:
the first set of first status information includes programming state status information.

16. The method of claim 9, wherein:
the plurality of memory die comprises eight NAND Flash memory die.

17. The method of claim 9, wherein:
the plurality of memory die includes a first memory die, the first memory die includes non-volatile memory that is monolithically formed in one or more physical levels of memory cells having active areas disposed above a silicon substrate.

18. A system, comprising:
a plurality of memory die; and
a controller configured to transmit a first status command to the plurality of memory die over a shared I/O bus that is connected to each memory die of the plurality of memory die and transmit a second status command to the plurality of memory die subsequent to transmitting the first status command to the plurality of memory die, the controller configured to receive a first type of status information from a first memory die of the plurality of memory die and a second type of status information different from the first type of status information from a second memory die of the plurality of memory die at the same time during a status information cycle based on the first status command, the first type of status information comprises a first number of bits and the second type of status information comprises the first number of bits, the controller configured to receive a third type of status information from the first memory die of the plurality of memory die and a fourth type of status information different from the third type of status information from the second memory die of the plurality of memory die at the same time during the status information cycle based on the second status command, the third type of status information comprises a second number of bits different from the first number of bits and the fourth type of status information comprises the second number of bits.

19. The system of claim 18, wherein:
the first type of status information comprises erase loop count information for the first memory die and the second type of status information comprises ready/busy status information for the second memory die.

20. The system of claim 18, wherein:
the first status command configured to determine the first number of bits of the shared I/O bus to be used by each memory die of the plurality of memory die during the status information cycle.

\* \* \* \* \*